(12) United States Patent
Wang et al.

(10) Patent No.: US 11,011,729 B2
(45) Date of Patent: May 18, 2021

(54) DISPLAY MODULE AND METHOD OF MANUFACTURING SAME

(71) Applicant: Wuhan China Star Optoelectronics Semiconductor Display Technology Co., Ltd., Wuhan (CN)

(72) Inventors: Haifeng Wang, Wuhan (CN); Qiang Tao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 116 days.

(21) Appl. No.: 16/331,154

(22) PCT Filed: Nov. 2, 2018

(86) PCT No.: PCT/CN2018/113620
§ 371 (c)(1),
(2) Date: Mar. 7, 2019

(87) PCT Pub. No.: WO2020/056873
PCT Pub. Date: Mar. 26, 2020

(65) Prior Publication Data
US 2020/0136085 A1 Apr. 30, 2020

(30) Foreign Application Priority Data
Sep. 20, 2018 (CN) .......................... 201811099480.6

(51) Int. Cl.
*H05K 1/00* (2006.01)
*H01L 51/52* (2006.01)
(Continued)

(52) U.S. Cl.
CPC ........ *H01L 51/5246* (2013.01); *H01L 27/323* (2013.01); *H01L 51/0097* (2013.01); *H01L 51/5281* (2013.01); *H01L 51/56* (2013.01); *H05K 1/147* (2013.01); *H05K 1/189* (2013.01); *H05K 3/361* (2013.01); *H05K 5/0017* (2013.01);
(Continued)

(58) Field of Classification Search
USPC ........................................................ 361/749
See application file for complete search history.

(56) References Cited

U.S. PATENT DOCUMENTS

2014/0217382 A1* 8/2014 Kwon ................. H01L 51/5246
257/40
2016/0374193 A1 12/2016 Namkung
(Continued)

FOREIGN PATENT DOCUMENTS

CN 106898264 6/2017
CN 206946143 1/2018
(Continued)

*Primary Examiner* — Andargie M Aychillhum

(57) ABSTRACT

A display module and a manufacturing thereof are provided. The display module includes a display panel, a first back plate, a second back plate and support layer and a fixing layer. The fixing layer includes a body and at least one protrusion. The display panel includes a first region, a second region and a bending region. At least one via hole is defined in the second back plate and the second region. The second region is bent to a predetermined position on the second back plate with the at least one protrusion fittingly engaged in the at least one via hole.

12 Claims, 5 Drawing Sheets

(51) Int. Cl.
*H01L 27/32* (2006.01)
*H01L 51/00* (2006.01)
*H01L 51/56* (2006.01)
*H05K 1/14* (2006.01)
*H05K 1/18* (2006.01)
*H05K 3/36* (2006.01)
*H05K 5/00* (2006.01)
*H05K 5/03* (2006.01)

(52) U.S. Cl.
CPC ........ *H05K 5/03* (2013.01); *H01L 2251/5338* (2013.01); *H05K 2201/056* (2013.01); *H05K 2201/10128* (2013.01)

(56) References Cited

U.S. PATENT DOCUMENTS

2017/0090661 A1* 3/2017 Kim .................... H01L 27/3276
2018/0286293 A1   10/2018 Liu
2018/0292865 A1* 10/2018 Liao ..................... G06F 1/1637

FOREIGN PATENT DOCUMENTS

| CN | 207624701 | 7/2018 |
|----|-----------|--------|
| CN | 207800055 | 8/2018 |

* cited by examiner

DISPLAY MODULE AND METHOD OF MANUFACTURING SAME

RELATED APPLICATIONS

This application is a National Phase of PCT Patent Application No. PCT/CN2018/113620 having International filing date of Nov. 2, 2018, which claims the benefit of priority of Chinese Patent Application No. 201811099480.6 filed on Sep. 20, 2018. The contents of the above applications are all incorporated by reference as if fully set forth herein in their entirety.

FIELD AND BACKGROUND OF INVENTION

The present invention relates to a field of display, and more particularly to a display module and a method of manufacturing the same.

With development of technology, display devices such as mobile phones, tablets, and computers have become an indispensable part of people's daily lives. Public demands for a large screen on display devices under operation, and display devices having a thin frame and a high screen ratio are becoming popular. An OLED display device has features such as thin, light, low power consumption, and durability, can be bent, and has a high screen ratio.

Currently, a bending region of the display panel in the OLED display device has become a key point to study in the display industry. In existing display panels, the bending region of the display panel is bent before pre-alignment with marking.

Although the display panel is bent through this technique, it is affected by hardness of display panel material. Further, it cannot effectively guarantee a bending position and a bending angle in the display panel. Therefore, there is a need for a display module and a method of manufacturing the same to solve the above problems.

SUMMARY OF THE INVENTION

A display module and a method of manufacturing the same provided by the present invention solves the problem that the bending accuracy of the bending region of the display panel in the display module is not precise that leads to incorrect alignment.

According to one aspect of the present invention, A display module includes:

a display panel including a first region, a second region, and a bending region connecting the first region to the second region, and the first region is provided with a pixel array, the second region includes a terminal region, and the bending region has a radius greater than 0.4 mm and less than 0.6 mm;

a back plate layer provided on a surface of one side of the display panel, and the back plate layer includes a first back plate and a second back plate, and the second back plate is located on a surface of the second region;

a support layer provided between the first back plate and the second back plate, and the first back plate and the second back plate are fixed by the support layer, the support includes a foam layer, a graphite layer, and a copper layer; and a fixing layer provided between the second back plate and the support layer, and the fixing layer includes a body and at least one protrusion disposed on the body; and at least one via hole is provided in the second back plate and the second region, the at least one via hole matches the at least one protrusion, and the second region is bent to a predetermined position on the second back plate with the at least one protrusion fittingly engaged in the at least one via hole.

In one embodiment of the present invention, the second region includes a substrate and a functional device disposed on the substrate, and the at least one via hole is disposed outside the functional device.

In one embodiment of the present invention, the fixing layer includes two protrusions, and the protrusions are distributed at two ends of a surface of the body.

In one embodiment of the present invention, the body of the fixing layer is provided at a surface of the second back plate and does not protrude beyond a boundary of the second back plate.

In one embodiment of the present invention, the at least one protrusion is a columnar protrusion, and a height of the columnar protrusion is not greater than a depth of the at least one via hole.

According to another aspect of the present invention, a display module includes:

a display panel including a first region, a second region and a bending region connecting to the first region and the second region, and the first region is provided with a pixel array, and the second region comprises a terminal region;

a back plate layer provided on a surface of one side of the display panel, and the back plate layer includes a first back plate and a second back plate, and the second back plate is located on a surface of the second region;

a support layer provided between the first back plate and the second back plate, and the first back plate and the second back plate are fixed by the support layer, the support includes a foam layer, a graphite layer, and a copper layer; and a fixing layer provided between the second back plate and the support layer, and the fixing layer comprises a body and at least one protrusion disposed on the body; and at least one via hole is provided in the second back plate and the second region, the at least one via hole matches the at least one protrusion, and the second region is bent to a predetermined position on the second back plate with the at least one protrusion fittingly engaged in the at least one via hole.

In one embodiment of the present invention, the second region includes a substrate and a functional device disposed on the substrate, and the at least one via hole is disposed outside the functional device.

In one embodiment of the present invention, the fixing layer includes two protrusions, and the protrusions are distributed at two ends of a surface of the body.

In one embodiment of the present invention, the body of the fixing layer is provided at a surface of the second back plate and does not protrude beyond a boundary of the second back plate.

In one embodiment of the present invention, the at least one protrusion is a columnar protrusion, and a height of the columnar protrusion is not greater than a depth of the at least one via hole.

In one embodiment of the present invention, the terminal region comprises an outer lead bonding region.

In one embodiment of the present invention, the display module further includes:

a touch control layer provided on the display panel that facing away from a side of the first back plate, and the touch control layer includes a touch control electrode layer and a touch flexible circuit board;

an optical adhesive layer provided between the first region and the touch control electrode layer;

a polarizing layer provided on the touch control electrode layer;

a cover plate provided on the polarizing layer;

a first flexible circuit board provided on a surface of the second region facing away from a side of the second back plate; and a second flexible circuit board attached to the first flexible circuit board.

In one embodiment of the present invention, a first driving circuit is attached to the first flexible circuit board.

In one embodiment of the present invention, a second driving circuit is attached to the second flexible circuit board.

According to the other aspect of the present invention, a method of manufacturing a display module includes:

step S10 providing a display panel, and the display panel includes a first region, a second region, and a bending connecting the first region to the second region, and the first region is provided with a pixel array;

step S20 attaching a first back plate to a surface of the first region, and a second back plate is provided on a surface of the second region to form a back plate layer including the first back plate and the second back plate;

step S30 providing a support layer and a fixing layer in sequence on a side of the first back plate facing away from the display panel, and the fixing layer comprises a body and at least one protrusion disposed on the body; and step S40 defining at least one via hole matching the at least one protrusion at the second back plate and a target position of the second region, and the bending region is bent with the at least one protrusion fittingly engaged in the at least one via hole.

In one embodiment of the present invention, and the at least one via hole penetrate through the second back plate and the second region.

In one embodiment of the present invention, the at least one via hole is defined at the second back plate and the second region by laser cutting.

In one embodiment of the present invention, the second region includes a terminal region.

In one embodiment of the present invention, the display module further includes:

a touch control layer provided on the display panel that facing away from a side of the first back plate, and the touch control layer includes a touch control electrode layer, and a touch flexible circuit board;

an optical adhesive layer provided between the first region and the touch control electrode layer;

a polarizing layer provided on the touch control electrode layer;

a cover plate provided on the polarizing layer;

a first flexible circuit board provided on a surface of the second region facing away from a side of the second back plate; and a second flexible circuit board attaching to the first flexible circuit board.

In one embodiment of the present invention, a first driving circuit is attached to the first flexible circuit board.

An advantage of the present application is to provide a display module and a method of manufacturing the same. The method includes providing a fixing layer having at least one protrusion in a display panel, defining at least one via hole in a display panel and a back plate layer and engaging at least one protrusion in at least one via hole. Accordingly, a bending angle of the display panel is constant so that a bending accuracy is achieved.

BRIEF DESCRIPTION OF THE SEVERAL VIEWS OF THE DRAWINGS

In order to more clearly illustrate embodiments or technical solutions in the present invention, the drawings used in the description of the embodiments or current technology will be briefly described below. Obviously, the drawings in the following description are merely some embodiments of the present invention. A person skilled in the art may also obtain other drawings without any creative efforts.

DESCRIPTION OF SPECIFIC EMBODIMENTS OF THE INVENTION

Figure 1:
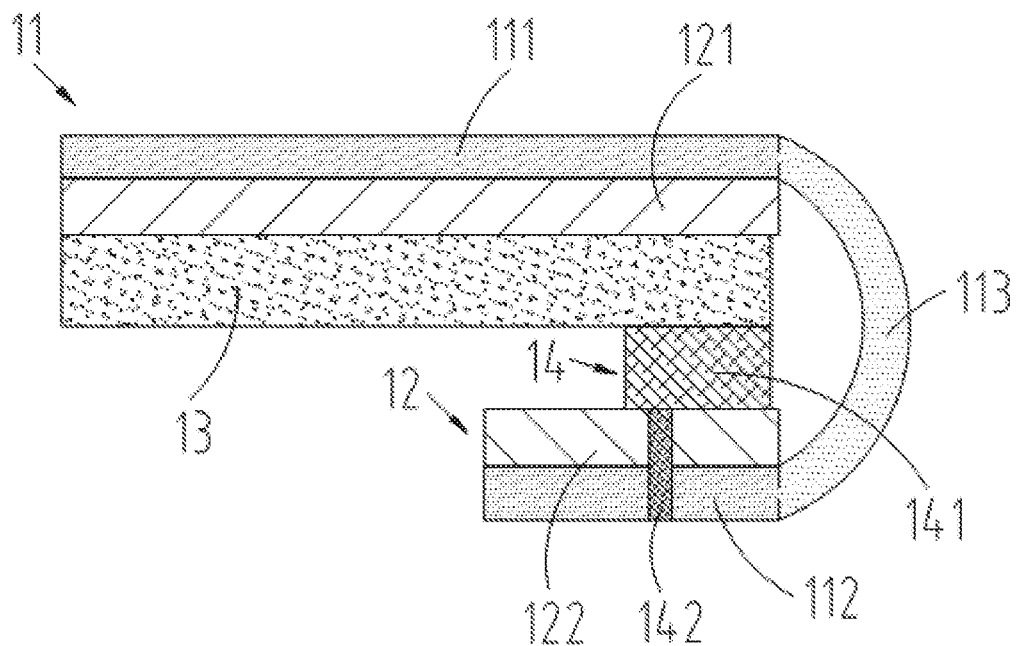
FIG. 1 is a schematic structural view of a display module according to a first embodiment of this invention.

The following description of the embodiments is provided by reference to the following drawings. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figures, elements with similar structure are indicated by the same reference numerals.

A display module and a method of manufacturing the same provided by the present invention solve the problem that the bending accuracy of the bending region of the display panel in the display module is not precise that leads to incorrect alignment. Accordingly, the present provides embodiments to solve above problem.

The drawings and specific embodiments of the present invention are further described as follows.

Figure 2:
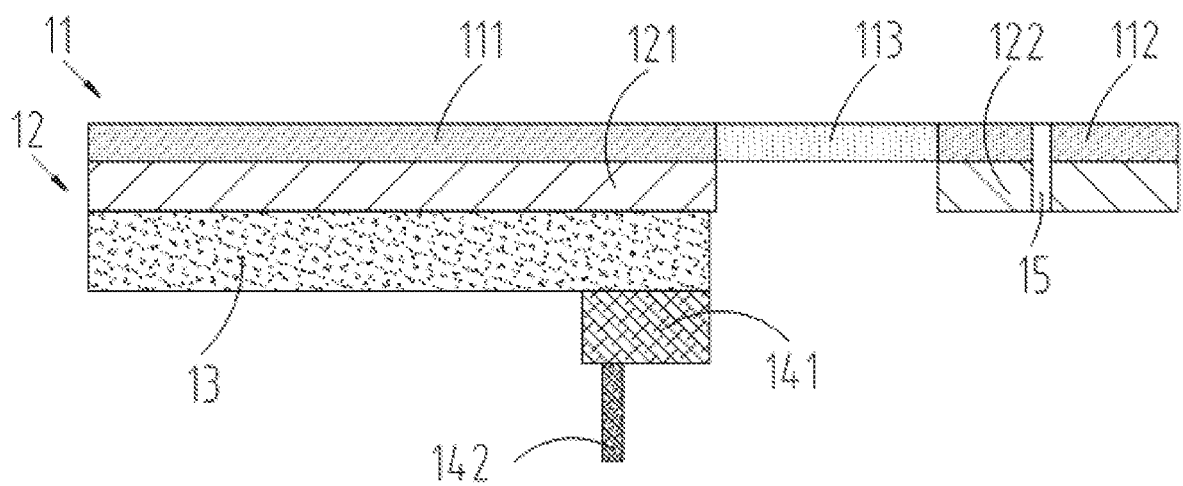
FIG. 2 is a schematic structural view of the display module in an unbent state according to the first embodiment of this invention.
Figure 3:
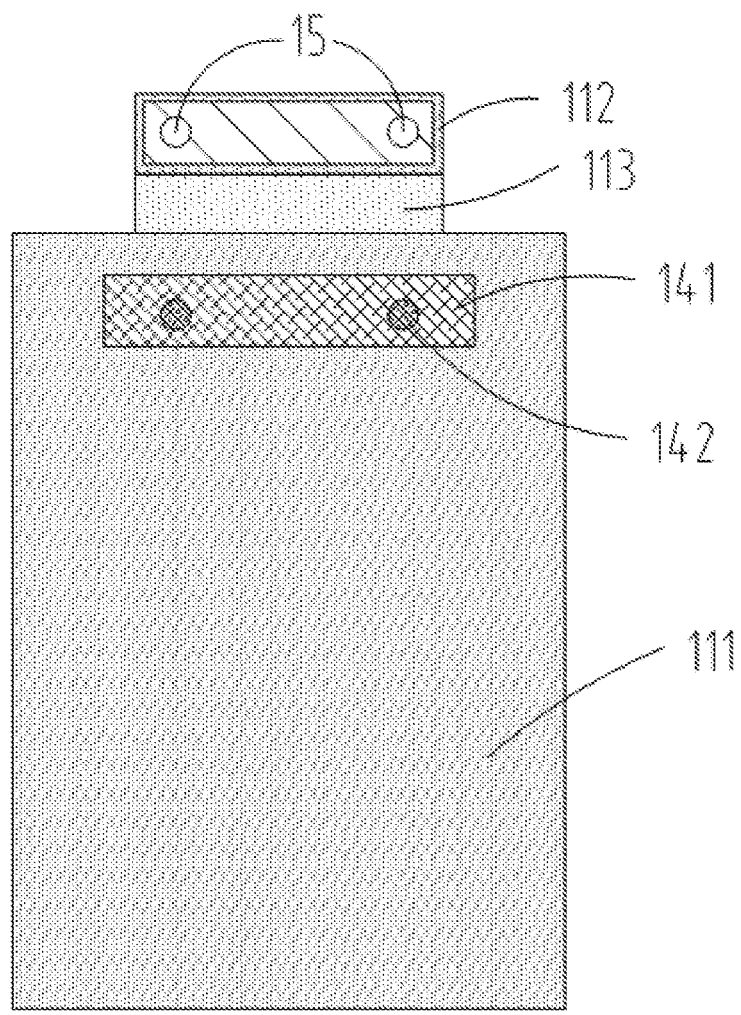
FIG. 3 is a top plan view of the display module in an unbent state according to the first embodiment of this invention.

According to the first embodiment of the present invention, a display module provided by the present invention as shown in FIG. 1, FIG. 2, and FIG. 3 includes a display panel 11 containing a first region 111, a second region 112 and a bending region 113 connecting the first region 111 to the second region 112. The first region 111 is provided with a pixel array, and the second region 112 is bent to a back side of the first region 111 through the bending region 113, and the second region 112 includes a terminal region.

In one embodiment, the first region 111 includes a display region for carrying out display function of the display panel 11. The bending region 113 has a body made of a flexible organic material. Metal traces connecting the first region 111 to the drive circuit are arranged side by side. In the display panel 11, the bending region 113 is presented as a bending state so as to implement a narrow frame of the display device. Of course, the structure of the bending region 113 is not limited to the organic material and the metal traces, and other related structures may be provided.

In one embodiment, the terminal region includes an outer lead bonding region. Metal traces provided in the outer lead bonding region are used for connecting the display panel 111 to a driving circuit.

A back plate layer 12 provided on a surface of one side of the display panel 11 includes a first back plate 121 and a second back plate 122, and the second back plate 122 is located on a surface of the second region 112.

A support layer 13 is provided between the first back plate 121 and the second back plate 122. The first back plate 121 and the second back plate 122 are fixed by the support layer 13.

In one embodiment, the support layer 13 includes a foam layer, a graphite layer, and a copper layer so as to support the display panel 11 and carry out heat dissipation.

A fixing layer 14 provided between the second back plate 122 and the support layer 13 is used for fixing the second back plate 122. The fixing layer 14 includes a body 141 and at least one protrusion 142 disposed on the body 141.

In one embodiment, the at least one protrusion 142 is a columnar protrusion so that the second back plate 122 is fittingly engaged with at least one via hole 15 of the second region 12, and thus the bending accuracy of the display panel is ensured. It can be understood that the at least one protrusion 142 can be either a cylindrical protrusion or a rhomboid protrusion. The specific shape can be designed according to actual needs and is not limited here.

In one embodiment, the at least one via hole 15 matching the least one protrusion 142 is provided in the second back plate 122 and the second region 112. The second region 112 is bent to a predetermined position on the second back plate 122 with the at least one protrusion 142 fittingly engaged in the least one via hole 15.

When the display panel is bent, the least one protrusion 142 in the fixed layer 14 can be overlapped with the least one via hole 15 provided in the second back plate 122 and the second region 112, and this the at least one protrusion 142 is fittingly engaged in the at least one via hole 15. Accordingly, the second region 112 of the display panel and the fixing layer 14 can be accurately aligned, and a bending accuracy of the bending region 113 is achieved. Further, the bending angle of the bending region 113 is controlled so as to improve the bending accuracy of the display panel 11.

In one embodiment, when the display panel 11 is bending, the bending region 113 has a radius greater than 0.4 mm and less than 0.6 mm.

In one embodiment, the second region 112 includes a substrate and a functional device disposed on the substrate. Generally, the substrate is a polyimide substrate.

The at least one via hole 15 is disposed outside the functional device. In one embodiment, the substrate includes a region covered by the functional device and a region not covered by the functional device. The at least one via hole 15 is defined in a region of the substrate that is not covered by the functional device so as to avoid affecting the structure of the functional device. Moreover, the functional device includes an outer lead device.

Figure 4:
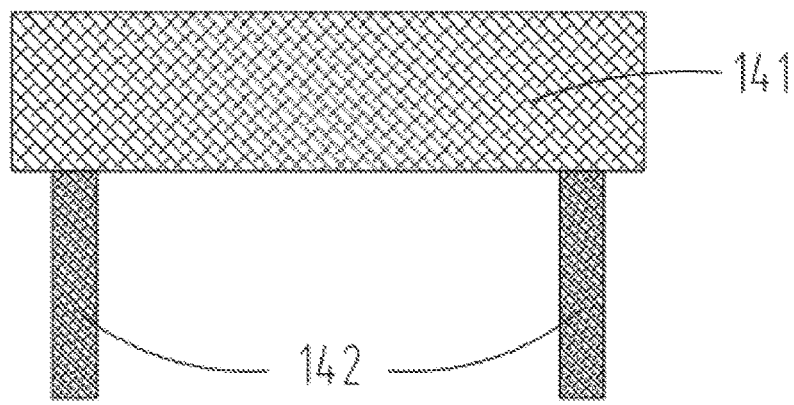
FIG. 4 is a schematic structural view of a fixing layer according to a second embodiment of this invention.

In one embodiment, as shown in FIG. 4, the fixing layer 14 includes two protrusions 142, and the two protrusions 142 are distributed at two ends of a surface of the body 141 and thus the at least one via hole 15 fittingly engaged in the at least one protrusion 142 is enhanced.

In one embodiment, the body 141 of the fixing layer 14 is provided at a surface of the second back plate 122 and does not protrude beyond the boundary of the second back plate 122. It also can be understood that area of the body 141 is less than the area of the second back plate 122, and thus preventing the fixing layer 14 from interfering or affecting other elements of the display module.

In one embodiment, a height of the at least one columnar protrusion 142 is not greater than a depth of the at least one via hole 15, and thus preventing the at least one columnar protrusion 142 from affecting other elements of the display module.

Figure 5:
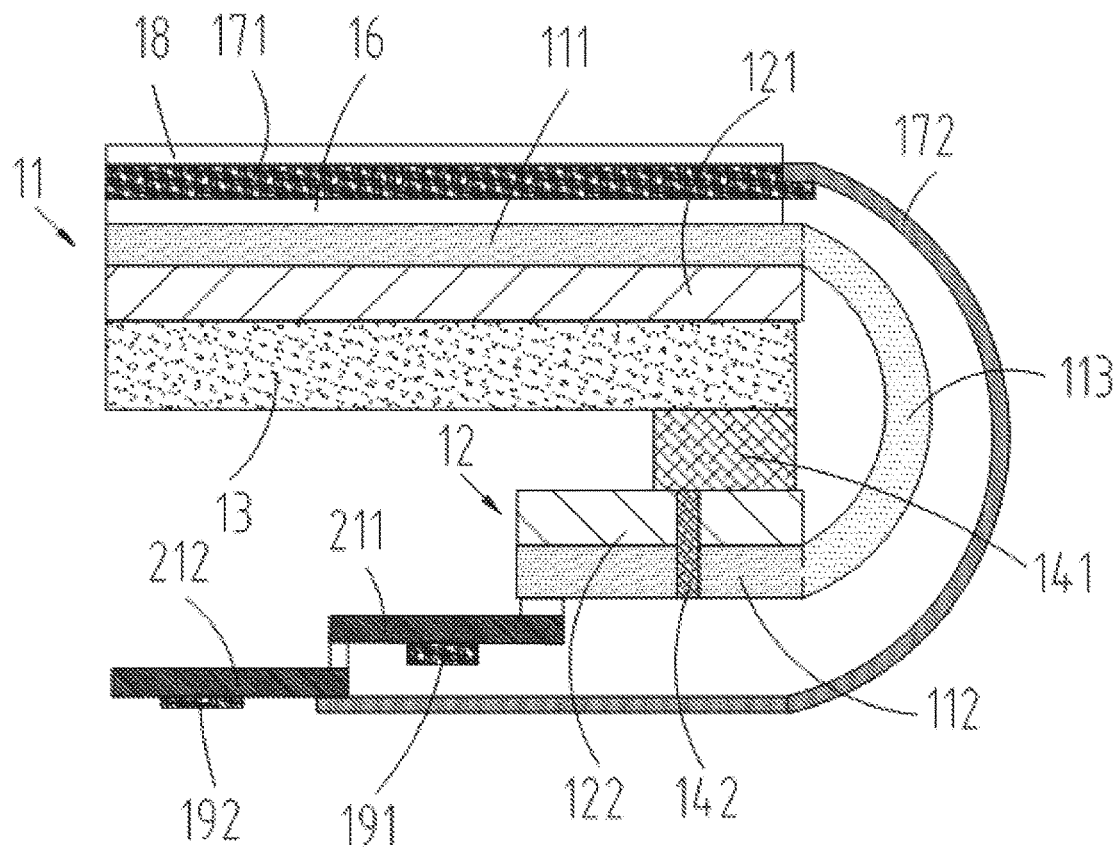
FIG. 5 is a schematic structural view of the display module according to a third embodiment of this invention.

Referring to FIG. 5, the display module further includes a touch control layer 17 provided on the display panel 11 that facing away from a side of the first back plate 121, and the touch control layer 17 includes a touch control electrode layer 171 and a touch flexible circuit board 172.

An optical adhesive layer 16 is provided between the first region 111 and the touch control electrode layer 171. The optical adhesive layer 16 is used for binding the first region 111 and the touch electrode layer 171.

A polarizing layer 18 is provided on the touch control electrode layer 171. In one embodiment, the display module further includes a cover plate attached on the polarizing layer 18.

A first flexible circuit board 211 is provided on a surface of the second region 112 facing away from a side of the second back plate 122, and a first driving circuit 191 is attached to the first flexible circuit board 211.

A second flexible circuit board 212 is attached to the first flexible circuit board 211, and a second driving circuit 192 is attached to the second flexible circuit board 212.

In one embodiment, an anisotropic conductive adhesive is used for binding the first flexible circuit board 211 and the second region 112, and it is also used for binding the first flexible circuit board 211 and the second flexible circuit board 212.

Figure 6:
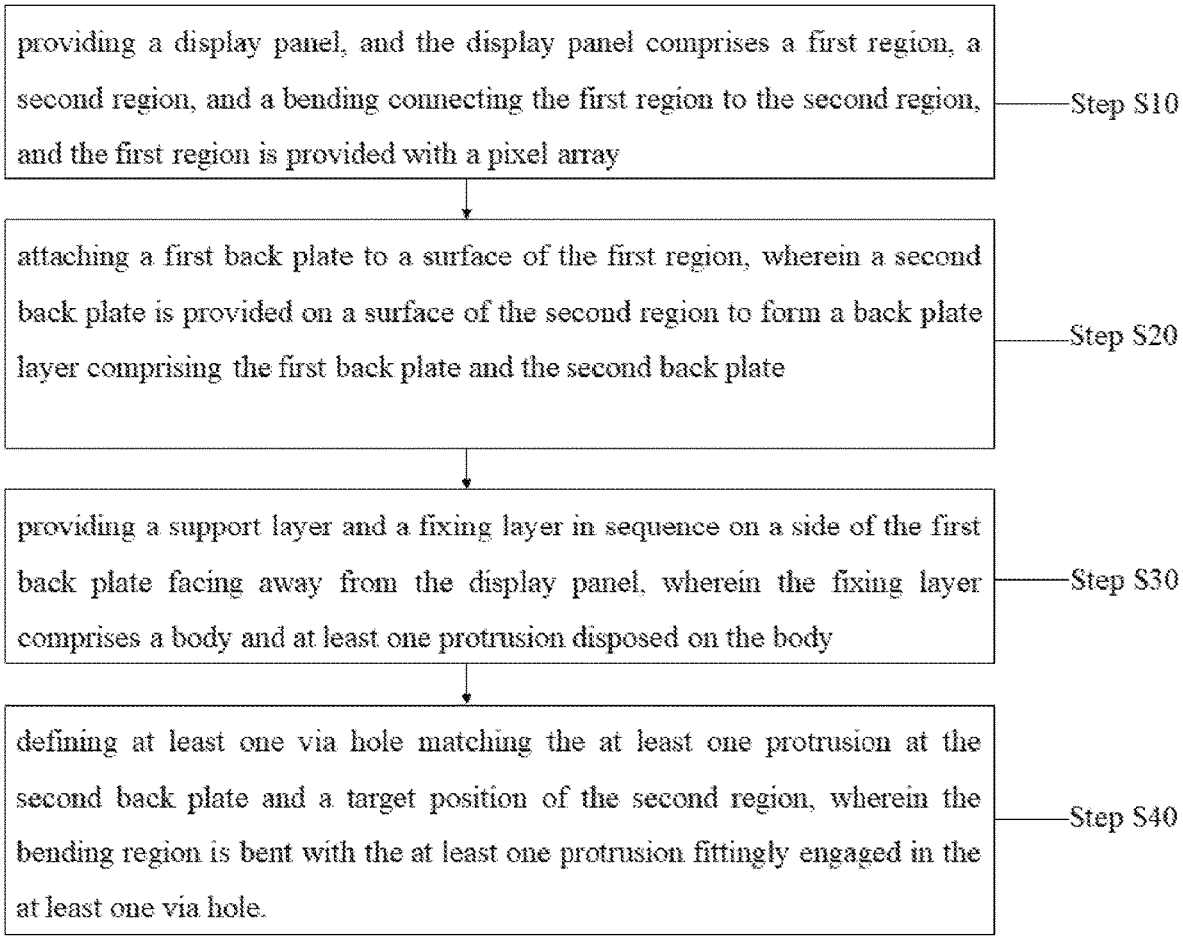
FIG. 6 is a schematic flowchart of a method for manufacturing a display module according to a fourth embodiment of this invention.

Referring to FIG. 6, the present invention further provides a method of manufacturing a display module, and the steps of the method are described as follows.

Step S10 provides a display panel, and the display panel includes a first region, a second region, and a bending region located between the first region and the second region, and the first region is provided with a pixel array.

Step S20 a first back plate is attached to a surface of the first region, and a second back plate is provided on a surface of the second region to form a back plate layer comprising the first back plate and the second back plate.

Step S30 provides a support layer and a fixing layer in sequence on a side of the first back plate facing away from the display panel, and the fixing layer includes a body and at least one protrusion disposed on the body.

Step S40 defines at least one via hole matching the at least one protrusion at the second back plate and a target position of the second region, and the bending region is bent with the at least one protrusion fittingly engaged in the at least one via hole.

In one embodiment, in a 2D fitting process, the fitting accuracy between the layers is typically plus or minus 100 microns. The cutting accuracy in the cutting process is plus or minus 50 microns. In the present invention, accuracy alignment of the display panel can be achieved by marking the alignment on the second back plate.

In one embodiment, the height of the at least one via hole is greater than the height of the at least one protrusion by 100 microns to 120 microns so as to avoid interference between thereof.

In one embodiment, the at least one via hole penetrates through the second back plate and the second region.

In one embodiment, at least one via hole is defined at the second back plate and the second region by laser cutting.

Figure 7:
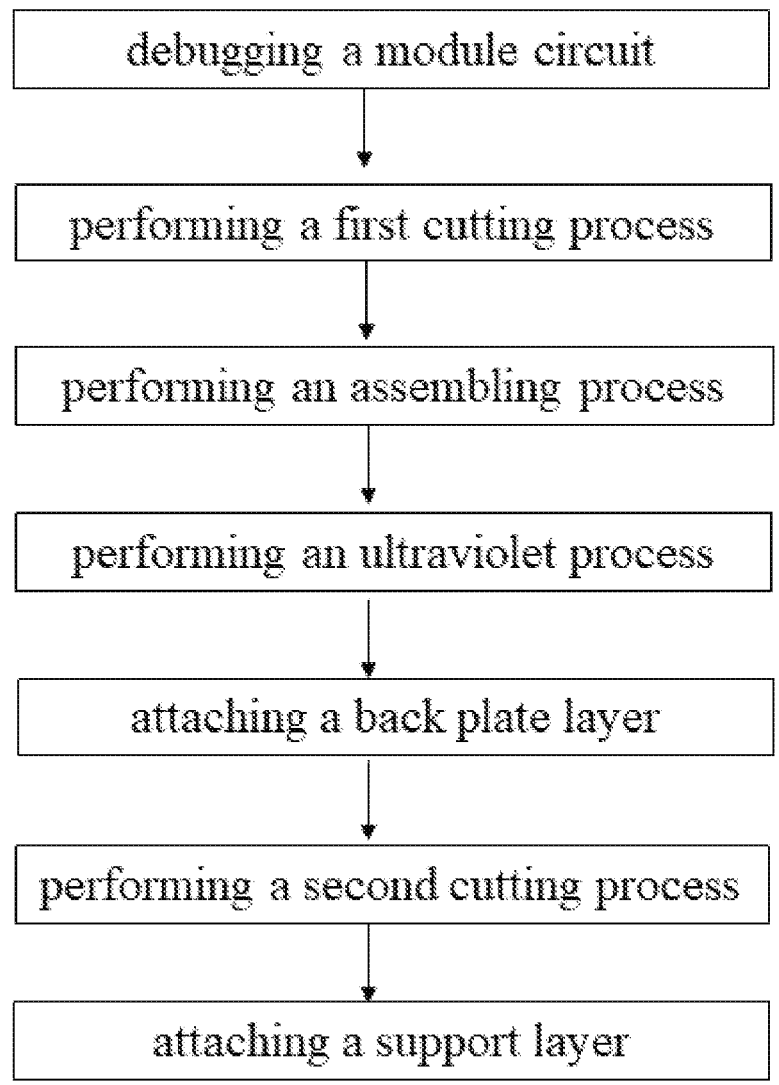
FIG. 7 is a flow chart of a method for manufacturing a display module according to a fourth embodiment of this invention.

Referring to FIG. 7, it is a flow chart of a method for manufacturing a display module of this invention. The first cutting process is performed after the display module circuit is debugged to be normal. Then, a whole display module block is cut into several display panels, and the related devices are assembled on the display panel. Subsequently, the related devices are fixed by an ultraviolet process, and a back plate layer is attached to the display pane. Next, excess parts of the display panel are cut while at least one via hole is defined in the second region and the second back plate in the cutting process. Then, a support layer and a fixing layer are attached to the display panel in sequence. Finally, the display panel is bent so that at least one protrusion is fittingly engaged in the at least one via hole.

An advantage of the present application is to provide a display module and a method of manufacturing the same. The method includes providing a fixing layer having at least one protrusion in a display panel, defining at least one via hole in a display panel and a back plate layer and engaging at least one protrusion in at least one via hole. Accordingly, a bending angle of the display panel is constant so that a bending accuracy is achieved.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A display module, comprising:
a display panel comprising a first region, a second region, and a bending region connecting the first region to the second region, wherein the first region is provided with a pixel array, the second region comprises a terminal region, and the bending region has a radius greater than 0.4 mm and less than 0.6 mm;
a back plate layer provided on a surface of one side of the display panel, wherein the back plate layer comprises a first back plate and a second back plate, and the second back plate is located on a surface of the second region;
a support layer provided between the first back plate and the second back plate, wherein the first back plate and the second back plate are fixed by the support layer, the support comprises a foam layer, a graphite layer, and a copper layer;
a fixing layer provided between the second back plate and the support layer, wherein the fixing layer comprises a body and at least one protrusion disposed on the body;
a first flexible circuit board provided on a surface of the second region facing away from a side of the second back plate, wherein a first driving circuit is attached to the first flexible circuit board; and
a second flexible circuit board attached to the first flexible circuit board, wherein a second driving circuit is attached to the second flexible circuit board;
wherein at least one via hole is provided in the second back plate and the second region, the at least one via hole matches the at least one protrusion, and the second region is bent to a predetermined position on the second back plate with the at least one protrusion fittingly engaged in the at least one via hole.

2. The display module according to claim 1, wherein the second region comprises a substrate and a functional device disposed on the substrate, and the at least one via hole is disposed outside the functional device.

3. The display module according to claim 1, wherein the fixing layer comprises two protrusions, and the protrusions are distributed at two ends of a surface of the body.

4. The display module according to claim 1, wherein the body of the fixing layer is provided at a surface of the second back plate and does not protrude beyond a boundary of the second back plate.

5. The display module according to claim 1, wherein the at least one protrusion is a columnar protrusion, and a height of the columnar protrusion is not greater than a depth of the at least one via hole.

6. A display module, comprising:
a display panel comprising a first region, a second region, and a bending region connecting to the first region and the second region, wherein the first region is provided with a pixel array, and the second region comprises a terminal region;
a back plate layer provided on a surface of one side of the display panel, wherein the back plate layer comprises a first back plate and a second back plate, and the second back plate is located on a surface of the second region;
a support layer provided between the first back plate and the second back plate, wherein the first back plate and the second back plate are fixed by the support layer, the support comprises a foam layer, a graphite layer, and a copper layer;
a fixing layer provided between the second back plate and the support layer, wherein the fixing layer comprises a body and at least one protrusion disposed on the body;
a first flexible circuit board provided on a surface of the second region facing away from a side of the second back plate, wherein a first driving circuit is attached to the first flexible circuit board; and
a second flexible circuit board attached to the first flexible circuit board, wherein a second driving circuit is attached to the second flexible circuit board;
wherein at least one via hole is provided in the second back plate and the second region, the at least one via hole matches the at least one protrusion, and the second region is bent to a predetermined position on the second back plate with the at least one protrusion fittingly engaged in the at least one via hole.

7. The display module according to claim 6, wherein the second region comprises a substrate and a functional device disposed on the substrate, and the at least one via hole is disposed outside the functional device.

8. The display module according to claim 6, wherein the fixing layer comprises two protrusions, and the protrusions are distributed at two ends of a surface of the body.

9. The display module according to claim 6, wherein the body of the fixing layer is provided at a surface of the second back plate and does not protrude beyond a boundary of the second back plate.

10. The display module according to claim 6, wherein the at least one protrusion is a columnar protrusion, and a height of the columnar protrusion is not greater than a depth of the at least one via hole.

11. The display module according to claim 6, wherein the terminal region comprises an outer lead bonding region.

12. The display module according to claim 6, wherein the display module further comprises:

a touch control layer provided on the display panel that facing away from a side of the first back plate, wherein the touch control layer comprises a touch control electrode layer and a touch flexible circuit board;

an optical adhesive layer provided between the first region and the touch control electrode layer;

a polarizing layer provided on the touch control electrode layer; and a cover plate provided on the polarizing layer.

* * * * *